US010862014B2

(12) United States Patent
Ho et al.

(10) Patent No.: US 10,862,014 B2
(45) Date of Patent: Dec. 8, 2020

(54) OPTICAL DEVICE PACKAGE AND METHOD OF MANUFACTURING THE SAME

(71) Applicant: Advanced Semiconductor Engineering, Inc., Kaohsiung (TW)

(72) Inventors: Hsin-Ying Ho, Kaohsiung (TW); Hsun-Wei Chan, Kaohsiung (TW); Lu-Ming Lai, Kaohsiung (TW); Shih-Chieh Tang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 49 days.

(21) Appl. No.: 14/939,331

(22) Filed: Nov. 12, 2015

(65) Prior Publication Data

US 2017/0138566 A1 May 18, 2017

(51) Int. Cl.
| | | |
|---|---|---|
| *H01L 33/60* | (2010.01) | |
| *H01L 25/075* | (2006.01) | |
| *H01L 33/46* | (2010.01) | |
| *H01L 33/48* | (2010.01) | |
| *H01L 33/62* | (2010.01) | |

(52) U.S. Cl.
CPC .......... *H01L 33/60* (2013.01); *H01L 25/0753* (2013.01); *H01L 33/46* (2013.01); *H01L 33/486* (2013.01); *H01L 33/62* (2013.01); *H01L 2224/48091* (2013.01)

(58) Field of Classification Search
CPC ....................................................... H01L 33/60
See application file for complete search history.

(56) References Cited

U.S. PATENT DOCUMENTS

| | | | |
|---|---|---|---|
| 6,608,334 B1 | 8/2003 | Ishinaga | |
| 9,231,176 B2* | 1/2016 | Ong | ........................ H01L 33/60 |
| 2008/0117500 A1* | 5/2008 | Narendran | ............. H01L 33/507 |
| | | | 359/326 |

(Continued)

FOREIGN PATENT DOCUMENTS

| | | |
|---|---|---|
| CN | 102163601 A | 8/2011 |
| CN | 102769089 A | 11/2012 |

(Continued)

OTHER PUBLICATIONS

Office Action and Search Report for corresponding Chinese Patent Application No. 201610996180.2, dated Mar. 30, 2020, 10 pages.

(Continued)

*Primary Examiner* — Alexander K Garlen
*Assistant Examiner* — Christopher E Dunay
(74) *Attorney, Agent, or Firm* — Foley & Lardner LLP

(57) ABSTRACT

In an aspect, an optical device includes a substrate, a light source mounted on a top surface of the substrate, and a lid attached to the top surface of the substrate, the lid defining a reflective cup positioned over the light source. In another aspect, an optical device includes a substrate, a light source disposed on the substrate, and a lid disposed on the substrate. The lid defines a reflective cup for concentrating and passing light from the light source. The optical device further includes a film formed on an inner sidewall of the reflective cup for reflecting the light from the light source. The film includes a primer layer, a reflecting layer and a protective layer.

15 Claims, 9 Drawing Sheets

(56) References Cited

U.S. PATENT DOCUMENTS

| | | | | |
|---|---|---|---|---|
| 2010/0014286 | A1* | 1/2010 | Yoneda | F21V 5/00 |
| | | | | 362/231 |
| 2012/0134178 | A1* | 5/2012 | Park | H01L 33/486 |
| | | | | 362/609 |
| 2012/0280262 | A1 | 11/2012 | Lin | |
| 2014/0211500 | A1* | 7/2014 | Min | H01L 25/0753 |
| | | | | 362/606 |
| 2015/0115138 | A1 | 4/2015 | Heng et al. | |
| 2016/0027977 | A1* | 1/2016 | Seo | H01L 33/60 |
| | | | | 257/98 |
| 2016/0268237 | A1* | 9/2016 | Lee | H01L 25/0753 |
| 2016/0322548 | A1* | 11/2016 | Abe | H01L 33/60 |
| 2017/0036948 | A1* | 2/2017 | Hanekawa | B32B 9/00 |

FOREIGN PATENT DOCUMENTS

| | | |
|---|---|---|
| CN | 203325962 U | 12/2013 |
| CN | 103972378 A | 8/2014 |
| CN | 105977246 A | 9/2016 |
| JP | 2009-295948 A | 12/2009 |

OTHER PUBLICATIONS

Office Action and Search Report in corresponding Taiwan Patent Application No. 105136930, dated Mar. 24, 2020, 10 pages.

\* cited by examiner

OPTICAL DEVICE PACKAGE AND METHOD OF MANUFACTURING THE SAME

BACKGROUND

1. Technical Field

The present disclosure relates to an optical device package and a method of manufacturing the same. In particular, the present disclosure relates to an optical device package having a light source and a method of manufacturing the same.

2. Description of the Related Art

Optical devices have become progressively more complex, driven at least in part by the demand for smaller sizes and enhanced processing speeds. At the same time, there is a demand to further miniaturize many electronic products containing these optical devices. Performance of an optical device package may be adversely affected by miniaturization. Accordingly, it would be desirable to have an optical device package that minimizes device performance impact while providing size-reduction of the optical device package.

SUMMARY

In an aspect, an optical device includes a substrate, a light source mounted on a top surface of the substrate, and a lid attached to the top surface of the substrate, the lid defining a reflective cup positioned over the light source.

In another aspect, an optical device includes a substrate, a light source disposed on the substrate, and a lid disposed on the substrate. The lid defines a reflective cup for concentrating and passing light from the light source. The optical device further includes a film formed on an inner sidewall of the reflective cup for reflecting the light from the light source. The film includes a primer layer, a reflecting layer and a protective layer.

In another aspect, a lid structure includes an upper portion, a lower portion, and a middle portion formed integrally with the upper portion and the lower portion, the upper portion and the middle portion defining a reflective cup, and the middle portion defining at least one recess. A reflective film covers an inner sidewall of the reflective cup in the upper portion and covers at least a portion of the inner sidewall in the middle portion.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Described in this disclosure are techniques for providing devices with reduced package sizes. The techniques are cost effective and compatible with packaging an illumination device using a light source such as a light emitting diode (LED) or other light source.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1A:
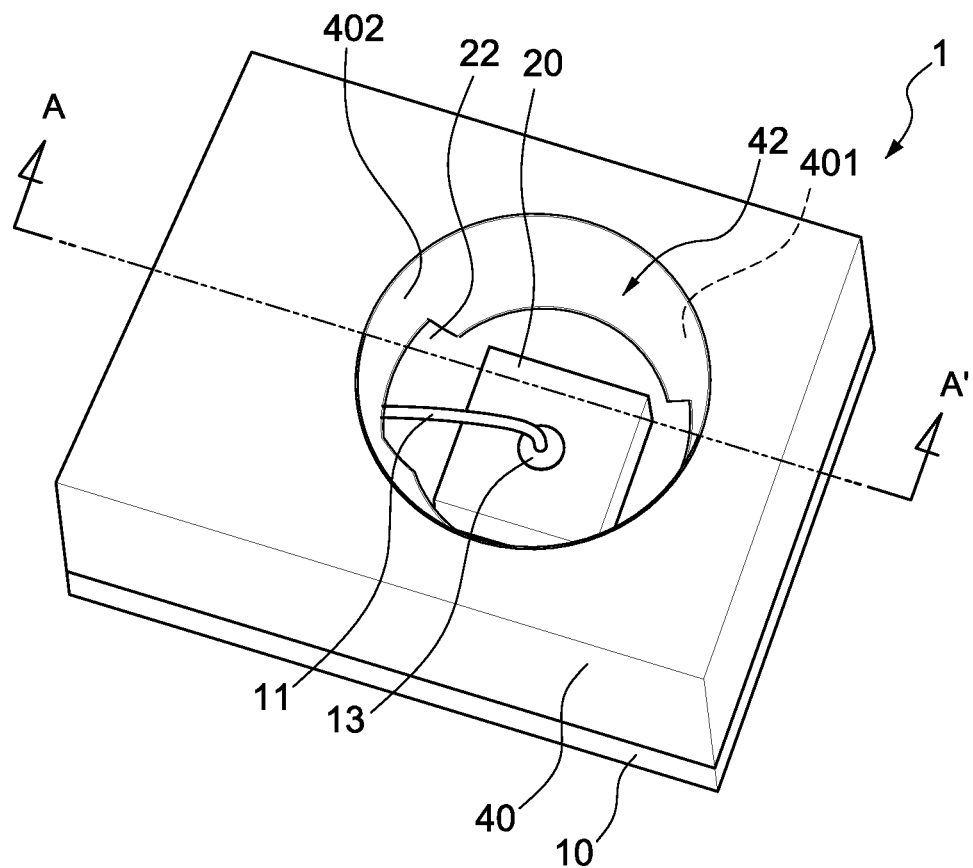
FIG. 1A is a perspective view of an optical device package in accordance with an embodiment of the present disclosure.

FIG. 1A is a perspective view of an optical device package 1 in accordance with an embodiment of the present disclosure. The optical device package 1 includes a substrate 10, a lid 40 (which may be a housing), a light source 20 (e.g., an LED die or a vertical-cavity surface-emitting laser (VCSEL) die), a die bonding pad 13, and a bonding wire 11. The lid 40 defines a reflective cup 42. A reflective film 402 is disposed on an inner sidewall 401 of the reflective cup 42, and one or more recesses 22 are defined in the reflective cup 42.

Figure 1B:
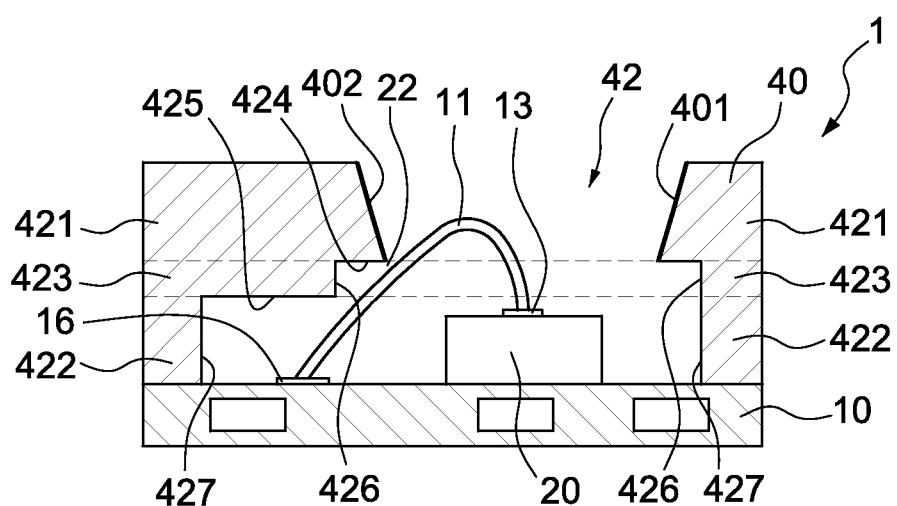
FIG. 1B is a cross-sectional view along line AA' across the optical device package of FIG. 1A.

FIG. 1B is a cross-sectional view along line AA' across the optical device package 1 of FIG. 1A. As shown in FIG. 1B, the optical device package 1 further includes a conductive pad 16. As also shown in FIG. 1B by dotted lines, the lid 40 includes an upper portion 421, a lower portion 422, and a middle portion 423. In the recesses 22, the upper portion 221 includes a lower surface 424. The middle portion 423 includes an inner surface 426 within the recesses 22, and further includes a lower surface 425. The lower portion 422 includes an inner surface 427. The reflective cup 42 is an aperture which allows light from the light source 20 to pass through the lid 40. The reflective cup 42 extends between the top surface of the lid 40 and the lower surface 425 of the middle portion 423. The inner sidewall 401 of the reflective cup 42 extends from the top surface of the lid 40 to the lower surface 425 of the middle portion 423, and extends around a circumference of the reflective cup 42 except at the recesses 22. The reflective film 402 is disposed on the inner sidewall 401 of the reflective cup 42 along the upper portion 421. In one or more embodiments, the reflective film 402 is also disposed on the inner sidewall 401 of the reflective cup 42 along portions of, or all of, the middle portion 423. In one or more embodiments, the reflective film 402 is further disposed on the inner surfaces 426 of the middle portion 423 in the recesses 22.

The light source 20 is bonded on a top surface of the substrate 10. The substrate 10 may be a lead frame, an organic substrate, a semiconductor substrate, a glass substrate, a ceramic substrate, an embedded substrate, a die with active components formed thereon, or other suitable substrate. The die bonding pad 13 is formed on a top surface of the light source 20. A terminal of the bonding wire 11 is bonded to the light source 20 and is electrically coupled to the light source 20 through the die bonding pad 13, and the other terminal of the bonding wire 11 is bonded to the conductive pad 16 and is electrically coupled to the substrate 10 through the conductive pad 16. The bonding wire 11 and the die bonding pad 13 may each include one of, or a combination of, copper (Cu), aluminum (Al), or other suitable materials. A loop portion of the bonding wire 11 extends within the reflective cup 42, such that the highest point of the loop portion of the bonding wire 11 is higher than the lower surface 425 of the middle portion 423 of the reflective cup 42.

The lid 40 is attached to the top surface of the substrate 10 at a bottom surface of the lower portion 422 of the lid 40. The lid 40 and the substrate 10 together form a space to accommodate the light source 20 and the bonding wire 11. The lid 40 may include metal, plastic, or other suitable material. In one or more embodiments, the light source 20 has a geometrical central axis and the reflective cup 42 has a geometrical central axis, and the geometrical central axis of the light source 20 is aligned with the geometrical central axis of the reflective cup 42. In one or more embodiments, the lower surface 425 of the middle portion 423 is substantially coplanar with a top surface of the light source 20. In one or more embodiments, the lower surface 425 of the middle portion 423 is lower than a top surface of the light source 20.

The recess 22 provides for a relatively shorter height for lid 40 (and thus a shorter height for the optical device package 1) by allowing the bonding wire 11 to be positioned in a notched area to pass through the reflective cup 42. Thus, for example, when the package height is reduced, the shape of the recess 22 can accommodate the bonding wire 11 so that the bonding wire 11 will not touch the lid 40 and cause a short circuit. Further, because the bonding wire 11 is accommodated by the recess 22, the bonding wire 11 will not be deformed by the lid 40. As can be seen, the recess 22 allows the reflective cup 42 to be closer to a light emitting surface of the light source 20, so the light concentrating effect of the reflective cup 42 is increased.

A cross-sectional perimeter of the reflective cup 42 may be circular, elliptical, or other shape. The cross-sectional perimeter of the reflective cup 42 may vary between the top surface of the lid 40 and the lower surface 425 of the middle portion 423. For example, a radius of the top portion 421 may be greater than a radius of the middle portion 423 not at the recess 22. For another example, as illustrated in FIG. 1B, the inner sidewall 401 of the reflective cup 42 may slope inwards from the top surface of the lid 40 to the lower surface 425 of the middle portion 423. Such a slope may be consistent, such that the reflective cup 42 is conically shaped. In one or more embodiments, the slope of the inner sidewall 401 is not consistent, such as a curved surface defined by a parabolic equation.

The reflection film 402 on the inner sidewall 401 may be, or may include, polished metal materials, plastic materials with a metal coating, or other suitable reflective materials. Examples of polished metal materials or metal coatings include Al, Cu, gold (Au), or silver (Ag), or an alloy thereof, or other suitable metal or alloy. The reflective film 402 increases reflectance of the inner sidewall 401. The reflective film 402 reflects and converges light from the light source 20. The reflectance of the reflective film 402 can be increased while the scattering of the reflective film 402 can be reduced, through a selection of materials to form the reflective film 402, and/or by improving a smoothness of the reflective film 402. The reflective film 402 may have a multi-layer structure. The multi-layer structure of the reflective film 402 may include a primer layer, a metal layer and a protective layer, for example.

Figure 1C:
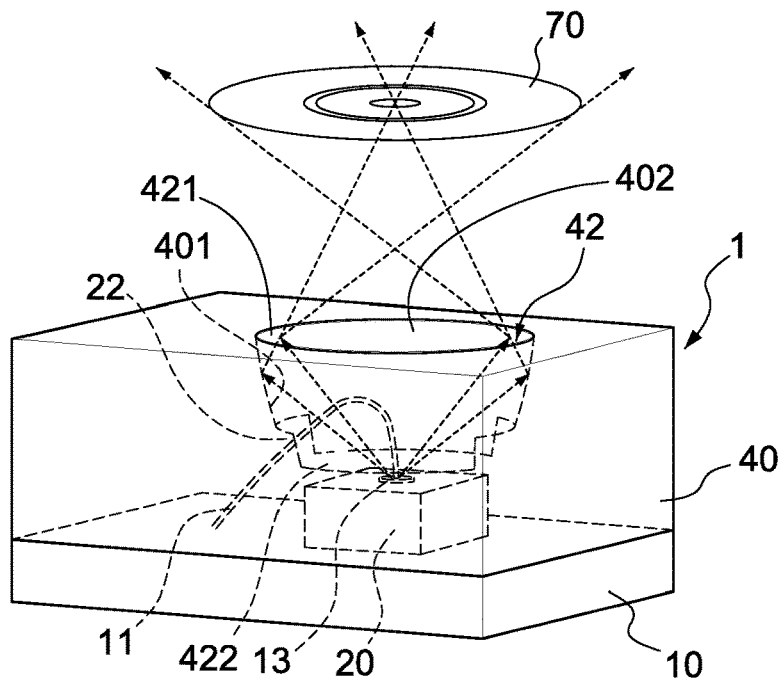
FIG. 1C is a perspective view of the optical device package of FIG. 1A.

FIG. 1C is a perspective view of the optical device package 1 of FIG. 1A, showing an embodiment of the reflective cup 42. Light emitted from the light source 20 passes through the reflective cup 42 and is reflected by the reflective film 402 on the inner sidewall 401. For example, as illustrated in FIG. 1C, light is reflected to and focused within a region 70 above the optical device package 1. The region 70 may be, but is not limited to, a circular region, and is in part defined by a shape of the reflective cup 42. Most of the light emitted from the light source 20 can be concentrated at the region 70, or at another region above the reflective cup 42, through a design of a surface curvature of the reflective cup 42 and the relative proportions of the upper portion 421, the lower portion 422 and the middle portion 423 of the lid 40.

Figure 2A:
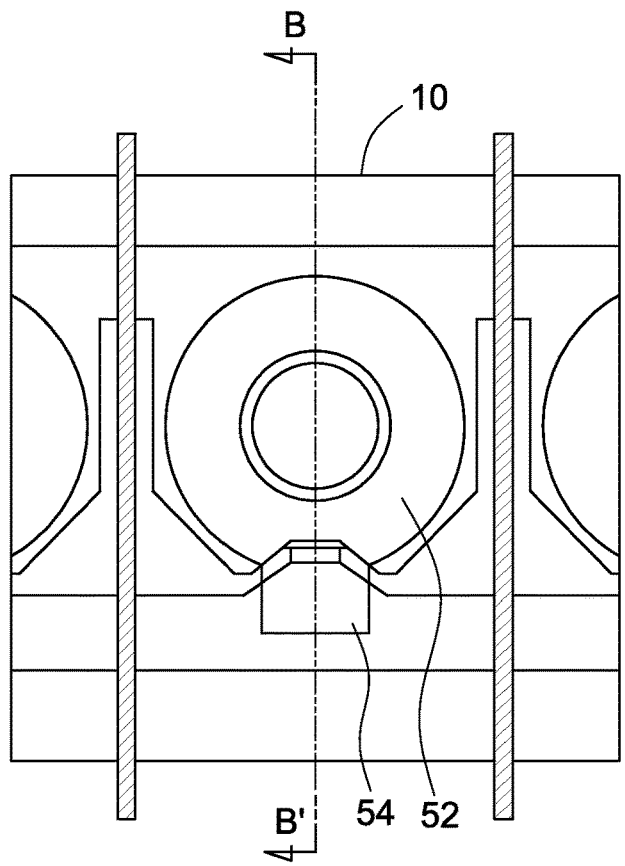
FIG. 2A is a top view of an optical device package in accordance with an embodiment of the present disclosure.

FIG. 2A is a top view of an optical device package 2 in accordance with an embodiment of the present disclosure.

Figure 2B:
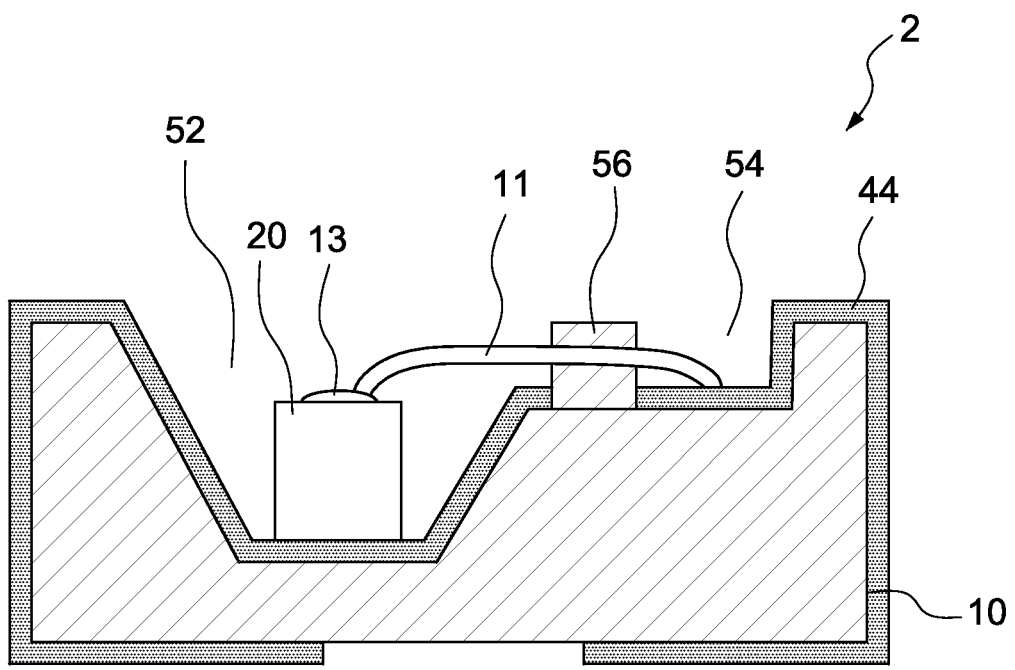
FIG. 2B is a cross-sectional view along line BB' across the optical device package of FIG. 2A.

FIG. 2B is a cross-sectional view along line BB' across the optical device package 2 of FIG. 2A. The optical device package 2 includes a substrate 10, a light source 20, a die bonding pad 13, a bonding wire 11 and a coating film 44. The substrate 10 defines two holes 52 and 54. The two holes 52 and 54 are separated from each other. A depth of the hole 52 is greater than the a depth of the hole 54, a volume of the hole 52 is greater than a volume of the hole 54, and a surface area of a sidewall of the hole 52 is greater than a surface area of a sidewall of the hole 54. The substrate 10 may include metal, plastic, or other suitable materials. After manufacturing the optical device package 2, a protective gel (not shown in FIG. 2B) is injected into the holes 52 and 54.

The coating film 44 is disposed on surfaces of the substrate 10. The light source 20 is disposed on the coating film 44 at a bottom surface of the hole 52. The die bonding pad 13 is formed on a top surface of the light source 20. A terminal of the bonding wire 11 is bonded on the light source 20 and is electrically coupled to the light source 20 through the die bonding pad 13, and the other terminal of the bonding wire 11 passes through a protrusion 56 of the substrate 10 and is electrically coupled to the substrate 10 at a bottom surface of the hole 54. The surfaces of the hole 52 serves as a reflective cup for the light source 20.

Figure 3A:
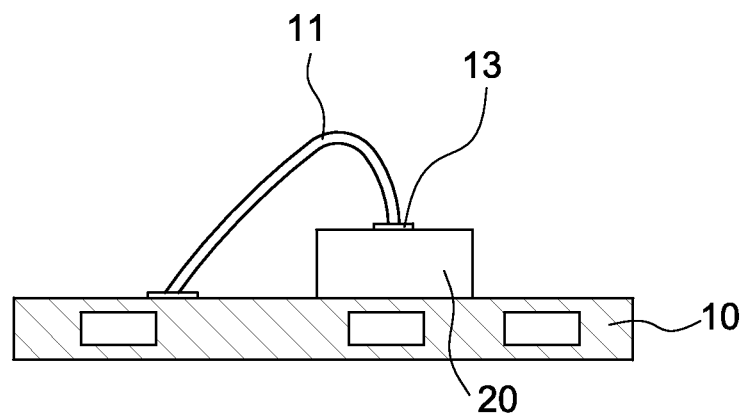
FIG. 3A, FIG. 3B, FIG. 3C and FIG. 3D illustrate a method of manufacturing an optical device package in accordance with an embodiment of the present disclosure.

FIGS. 3A-3D illustrate a method of manufacturing an optical device package in accordance with an embodiment of the present disclosure. Referring to FIG. 3A, a substrate 10 is provided. The substrate 10 may be a lead frame, an organic substrate, a semiconductor substrate, a glass substrate, a ceramic substrate, an embedded substrate, a die with active components formed thereon, or other suitable substrate. A light source 20 (e.g., a LED die or a VCSEL die) is positioned on a top surface of the substrate 10, and bonded using a die bonding technique. A die bonding pad 13 is then attached on the top surface of the light source 20. A terminal of the bonding wire 11 is bonded to the die bonding pad 13 using a wire bonding technique. The other terminal of the bonding wire 11 is bonded to the substrate 10 using a wire bonding technique.

Figure 3B:
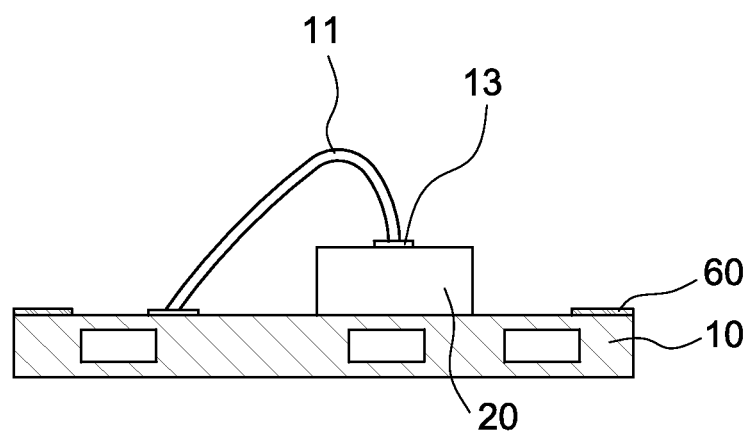

Referring to FIG. 3B, a gel 60 is dispensed on the top surface of the substrate 10.

Figure 3C:
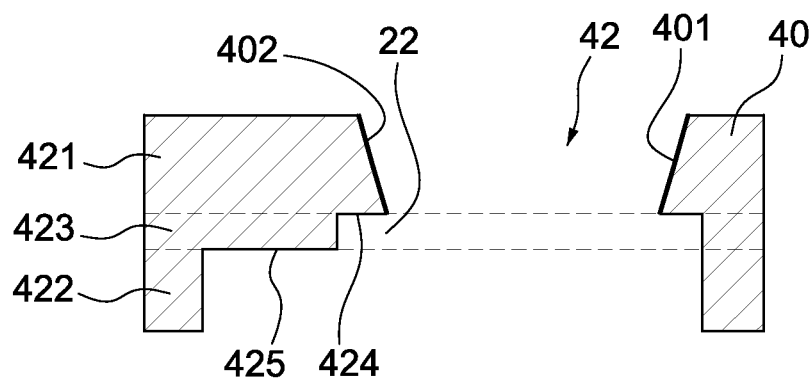

Referring to FIG. 3C, a lid 40 (which may be a housing) is prepared. The lid 40 may include metal, plastic, or other suitable materials. The lid 40 includes an upper portion 421, a lower portion 422, and a middle portion 423. The upper portion 421 and the middle portion 423 define a reflective cup 42 and one or more recesses 22. The recess 22 is defined in the middle portion 423, and includes an upper surface 424. The reflective cup 42 extends from a top surface of the lid 40 to a lower surface 425 of the middle portion 423. An inner sidewall 401 of the reflective cup 42 extends from the top surface of the lid 40 to the lower surface 425 of the middle portion 423 except where the recess 22 is defined. A radius of the reflective cup 42 at the top surface of the lid 40 is greater than a radius of the reflective cup at the lower surface 425 of the middle portion 423 not at the recess 22. A reflective film 402 is coated on the inner sidewall 401 of the lid 40. The reflective film 402 may be a multi-layer structure, such as formed using a coating technique.

Figure 3D:
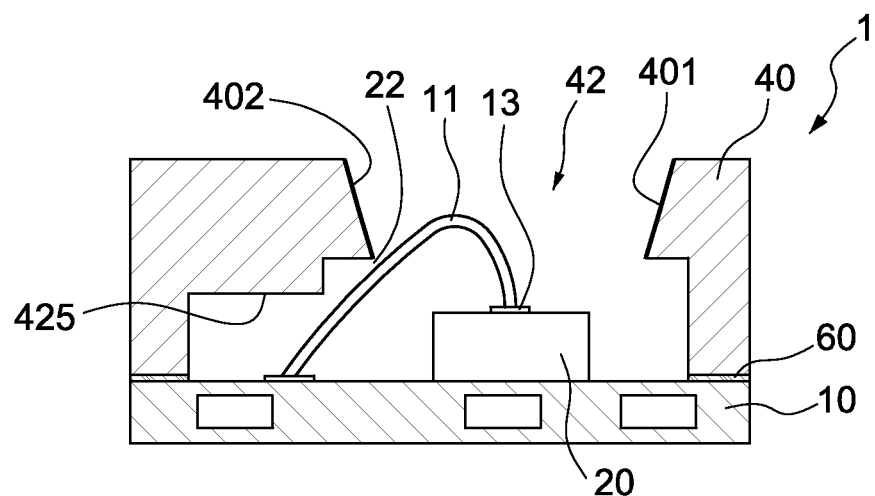

Referring to FIG. 3D, the lid 40 is positioned on the gel 60 and is attached to the top surface of the substrate 10 by the gel 60. The reflective cup 42 is disposed above the light source 20 by, for example, an alignment technique. The light source 20 has a geometrical central axis and the reflective cup 42 has a geometrical central axis, and the geometrical central axis of the light source 20 is aligned with the geometrical central axis of the reflective cup 42. An optical device package 1 (e.g., the optical device package 1 of FIGS. 1A and 1B) is thus obtained.

By way of comparison, the optical device package 1 of FIG. 3D may have a significantly smaller height and/or volume as compared to the optical device package 2 in FIG. 2B. In FIG. 2B, a lateral space should be reserved at the bottom of the hole 52 to allow for proper alignment of the light source 20 within the hole 52. In contrast, in FIG. 3D, the lid 40 is aligned over the light source 20, and it is not necessary to reserve a lateral space around the light source 20 for placement of the light source 20. Accordingly, a volume of the total optical device package 1 size as shown in FIG. 3D can be about 40% of the package size of the optical device package 2 of FIG. 2B. Additionally, a height of the optical device package 1 as shown in FIG. 3D can be about 84% of the package size of the optical device package 2 of FIG. 2B. Also, the optical device package 1 as shown in FIG. 3D does not need the protective gel described with respect to the optical device package 2 of FIG. 2B. The complexity and the cost of the manufacturing process can be reduced accordingly.

Figure 4A:
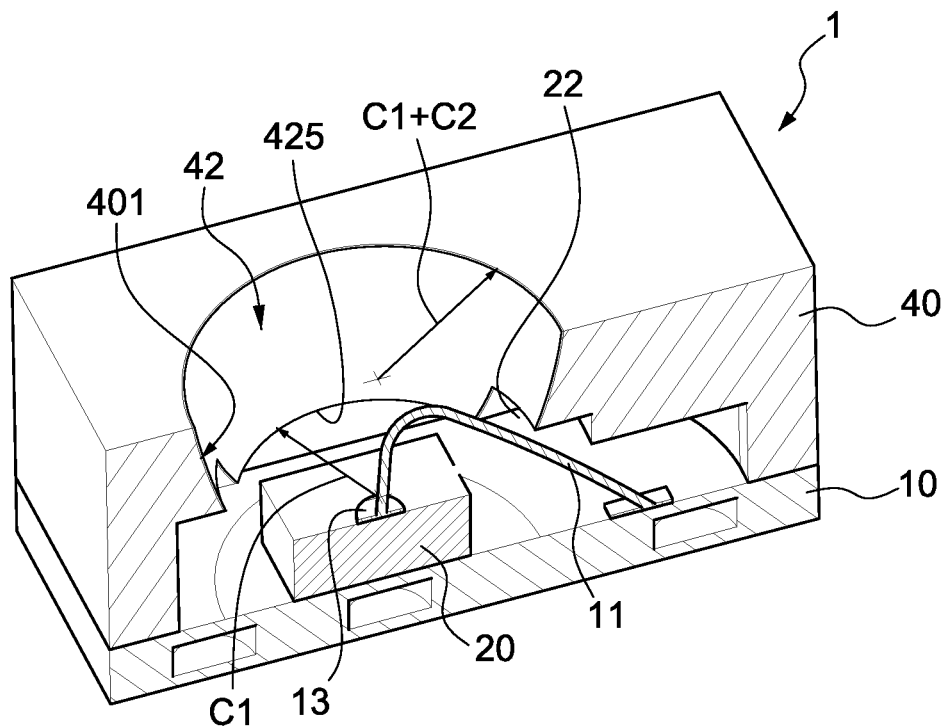
FIG. 4A is a perspective view of an optical device package in accordance with an embodiment of the present disclosure.

FIG. 4A is a perspective view of the optical device package 1 of FIG. 3D in accordance with an embodiment of the present disclosure. A radius from a geometrical central axis of the reflective cup 42 to a perimeter of the inner sidewall 401 at the lower surface 425 of the middle portion 423 (not at the recess 22) has a length C1, and a radius from the geometrical central axis of the reflective cup 42 to a perimeter of the inner sidewall 401 at the top surface of the lid 40 has a length C1+C2. Therefore, the radius of the reflective cup 42 at the top surface of the lid 40 is greater than the radius of the reflective cup at the lower surface 425 of the middle portion 423. An optimization of energy passing through the reflective cup 42 and focusing on a region (e.g., the region 70 in FIG. 1C) can be obtained through adjusting the ratio of the lengths C1 and C2. In one non-limiting example, the length C1+C2 is greater than C1 by about 25%, and, more generally, a ratio of C1+C2 and C1 can be about 1.05 or greater, about 1.1 or greater, about 1.15 or greater, about 1.2 or greater, or about 1.25 or greater. Additionally, an efficiency of light emission will be increased when the length C1 is greater than a radius of the top surface of the light source 20.

Figure 4B:
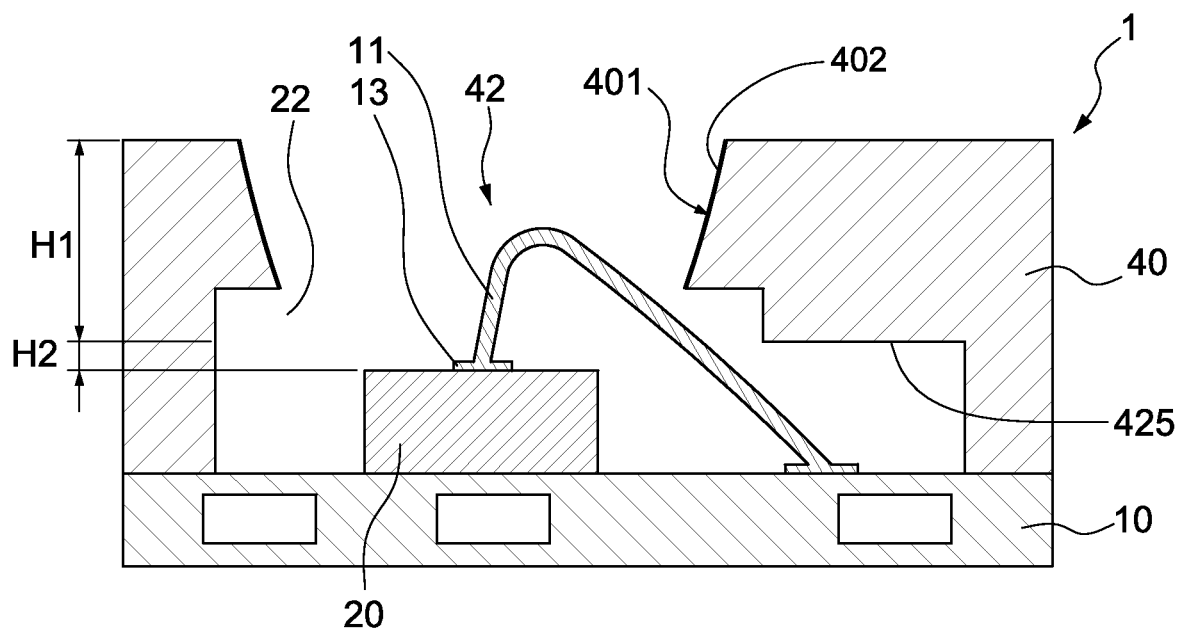
FIG. 4B is a cross-sectional view of the optical device package of FIG. 4A.

FIG. 4B is a cross-sectional view of the optical device package 1 of FIG. 4A according to an embodiment of the present disclosure. A height H1 is defined as a combined height of the upper portion 421 and the middle portion 423 of the lid 40. A height H2 is defined from the top surface of light source 20 to the lower surface 425 of the middle portion 423 of the lid 40. A light concentrating effect will be increased as the height H2 is reduced. In one or more embodiments, the height H2 is a negative value (i.e., the top surface of light source 20 is located above the lower surface 425 of the middle portion 423 of the lid 40, such that a portion of the light source 20 is located within the reflective cup 42). An efficiency of light emission for a negative height H2 may be greater than an efficiency of light emission for a positive height H2.

Figure 5:
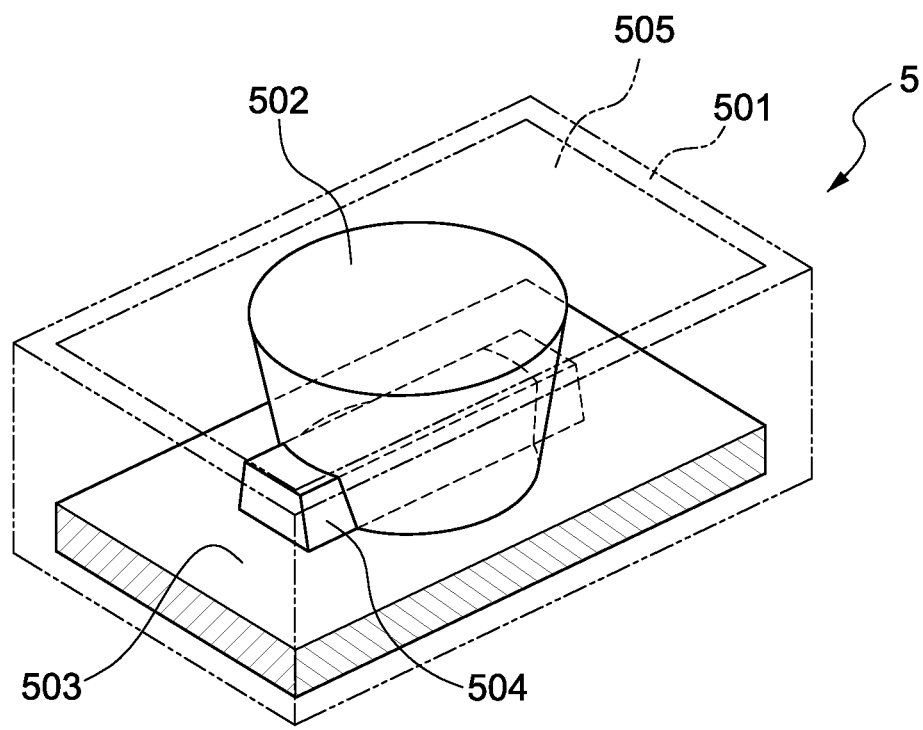
FIG. 5 is a perspective view of a mold for manufacturing a lid of the optical device package of FIG. 1A in accordance with an embodiment of the present disclosure.

FIG. 5 is a stereogram of a mold 5 for manufacturing the lid 40 of the optical device package 1 of FIG. 1A. The mold 5 has a sidewall portion 501, a bottom portion 503, a raised bar 504 and a cup-forming portion 502. During the manufacturing of the lid 40, a molding material is heated and melted. The melted molding material is filled into the recess of the mold 5 over the raised bar 504 and around the cup-forming portion 502. That is, the melted molding material is filled into a spacing 505 between the sidewall portion 501 and the cup-forming portion 502. The molding material may include polypropylene (PP), liquid crystal polymer (LCP) or other suitable materials. After the spacing 505 is filled with the melted molding material, the melted molding material is cured. The cup-forming portion 502 and the raised bar 504 on the bottom portion 503 are respectively used to form the reflective cup 42 and the one or more recesses 22 of the optical device package 1 (e.g., as shown in FIG. 1A). The shape, height, width, length or cross-sectional area or profile of the cup-forming portion 502 may be adjusted for other optical device packages. The shape, height, width, length or cross-sectional area or profile of the raised bar 504 may be adjusted to achieve a desired recess size and shape. For example, the length of the raised bar 504 may be shortened, or the raised bar 504 shifted, such that one recess 22 is formed instead of two. Referring to FIG. 5, the two recesses 22 of FIG. 1A are shown as symmetric (i.e., the raised bar 504 is centered under the cup-forming portion 502 during the molding stage); however, non-symmetric recesses 22 are within the scope of the present disclosure. In an embodiment, the recess 22 may be made by metal etching or laser drilling techniques; however, the complexity and the cost of the manufacturing process will be increased accordingly.

Figure 6:
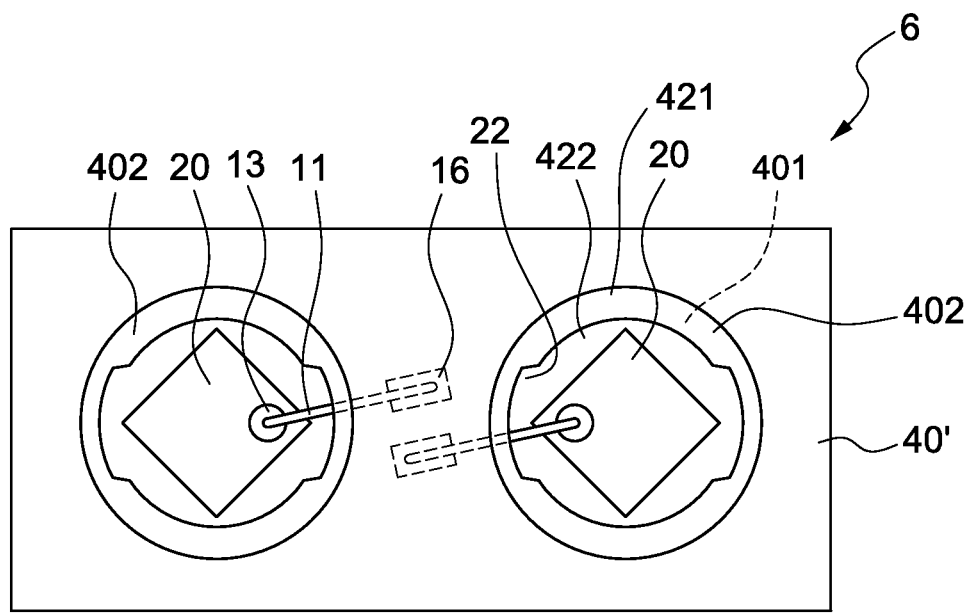
FIG. 6 is a top view of an optical device package in accordance with an embodiment of the present disclosure.

FIG. 6 is a top view an optical device package 6 in accordance with an embodiment of the present disclosure. The structure of the optical device package 6 is similar to the structure of the optical device package 1, except that a lid 40' (which may be a housing) defines two reflective cups 42. The arrangement shown in FIG. 6 is used to package two light sources 20. The optical device package 6 includes a substrate 10, a lid 40', two die bonding pads 13, two bonding wires 11 and two conductive pads 16. The concept may further be extended to packaging more than two light sources 20. The structure of one or more of the reflective cups 42 of the lid 40' may be similar to that of the reflective cup 42 of lid 40 of the optical device package 1. In the embodiment of FIG. 6, the two bonding wires 11 and the two conductive pads 16 are arranged toward the center of the optical device package 6 and do not contact each other.

Figure 7:
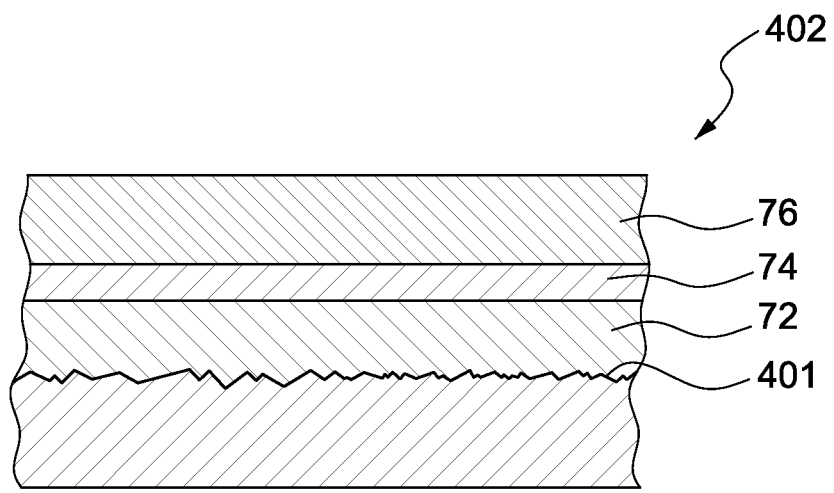
FIG. 7 is a cross-sectional view of a reflective film in accordance with an embodiment of the present disclosure.

FIG. 7 is a cross-sectional view of a reflective film 402 in accordance with an embodiment of the present disclosure. The reflective film 402 is formed on an inner sidewall 401. The surface of the inner sidewall 401 is relatively rough as compared to the reflective film 402. In this embodiment, the reflective film 402 has a multi-layer structure including a primer layer 72, a metal layer 74 and a protective layer 76. The primer layer 72 may include a thermosetting polymer or plastic. The inner sidewall 401 may include a thermoplastic polymer or plastic. The metal layer may include Au, Ag, Al, Cu, an alloy thereof, or other suitable metal or alloy. The primer layer 72 can increase an adhesive force of the metal layer 74 (i.e., a minimum adhesive force between the primer layer 72 and the metal layer 74). The primer layer 72 can improve the smoothness of the multi-layer structure for improved reflectance. For example, the coating of the primer layer 72 can increase reflectance at a surface of the reflective film 402 by about 10%. The protective layer 76 can also protect the multi-layer structure by avoiding oxidation reactions, moisture and other erosion, thereby increasing reliability of the reflective film 402.

Figure 8:
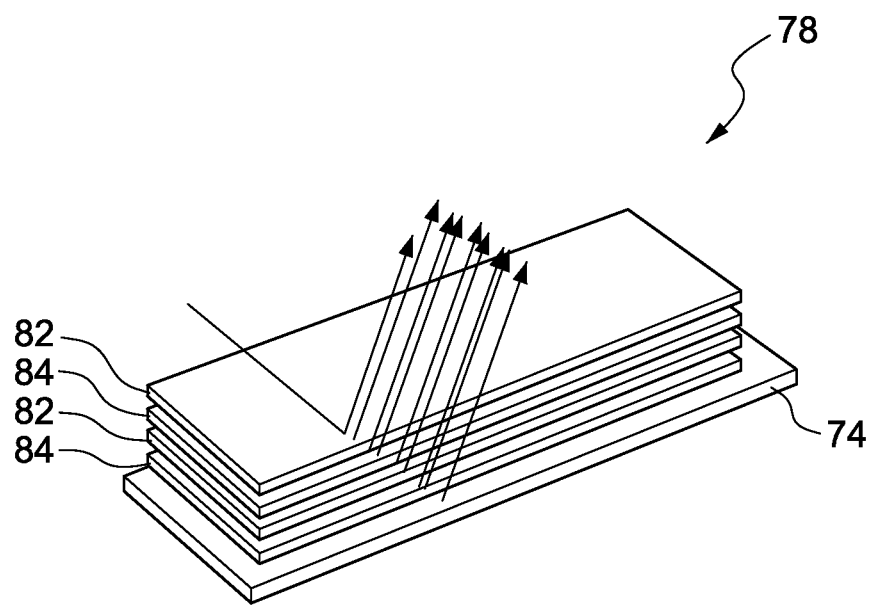
FIG. 8 is a perspective view of a reflective film in accordance with an embodiment of the present disclosure.

FIG. 8 is a reflective film 78 in accordance with another embodiment of the present disclosure. The reflective film 78 has a multi-layer reflector structure, which includes a metal layer 74, one or more low refractive index layers 82 and one or more high refractive index layers 84. The metal layer 74 may include Au, Ag, Al, Cu, an alloy thereof, or other suitable metal or alloy. The high refractive index layer 84 is disposed on the metal layer 74. The low refractive index layer 82 is disposed on the high refractive index layer 84; and the high refractive index layer 84 with the low refractive index layer 84 together form a layer pair. The low refractive index layer 82 may include, for example, silicon dioxide ($SiO_2$), or other suitable alloy materials, such as having a refractive index less than about 2. The high refractive index layer 84 may include, for example, niobium pentoxide ($Nb_2O_5$), titanium dioxide ($TiO_2$), or other suitable alloy materials, such as having a refractive index of about 2 or greater. The arrangement of a layer pair can increase reflectance. For example, alternating layer pairs (each including a high refractive index layer 84 and a low refractive index layer 82) can increase reflectance by about 0.5% per layer pair.

Figure 9:
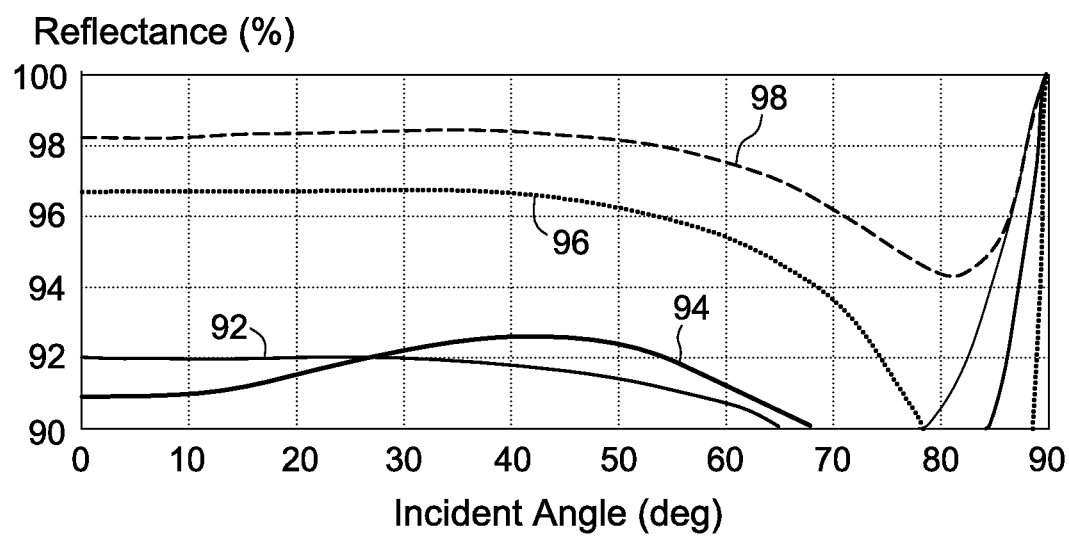
FIG. 9 provides simulation results of reflectance of light for different incident angles.

FIG. 9 provides simulation results 92, 94, 96 and 98 of reflectance of light from different incident angles on the multi-layer reflector structure 78 as shown in FIG. 8. The curve 92 represents reflectance corresponding to different incident angles when the light is incident on and reflected by a metal layer without the layer pairs of the multi-layer reflector structure 78. The curve 94 represents reflectance corresponding to different incident angles when the light is incident on a comparison structure including one low refractive index layer 82 disposed on the metal layer 74 and one high refractive index layer 84 disposed on the low refractive index layer 82. The curve 96 represents reflectance corresponding to different incident angles when the light is incident on the multi-layer reflector structure 78 including one layer pair of one high refractive index layer 84 disposed on the metal layer 74 and one low refractive index layer 82 disposed on the high refractive index layer 84, showing an increase in the reflectance of about 5%. The curve 98 represents the reflectance corresponding to different incident angles when the light is incident on the multi-layer reflector structure 78 including two layer pairs of the high refractive index layer 84 and low refractive index layer 82 sequentially stacked on the metal layer 74 (e.g., as shown in FIG. 8), showing a further increase in the reflectance. As the number of layer pairs in the multi-layer reflector structure 78 is increased, the reflectance increases.

In addition to the layer pairs and the metal layer 74 illustrated and described with respect to FIGS. 8 and 9, the multi-layer structure 78 may include a primer layer and/or a protective layer such as described with respect to FIG. 7. For example, the multi-layer structure 78 may include a primer layer, a reflecting layer (metal layer 74) disposed on the primer layer, one or more layer pairs disposed on the reflecting layer, and a protective layer disposed on the layer pairs.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Surfaces can be deemed to be "substantially coplanar" or "coplanar" if any displacement between the surfaces is no greater than 10 μm, such as no greater than 8 μm, no greater than 5 μm, or no greater than 1 μm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:
1. An optical device, comprising:
a substrate;
a first light source mounted on a top surface of the substrate;
a lid attached to the top surface of the substrate, the lid defining a first reflective cup positioned over the first light source and wherein a top surface of the first light source is positioned lower than the first reflective cup; and a bonding wire comprising a loop extending into the first reflective cup defined by the lid, the lid defining a first recess accommodating at least a portion of the bonding wire; and a reflective film on an inner sidewall of the first reflective cup, the reflective film being free from covering the top surface of the substrate, wherein the first light source has a geometrical central axis and the first reflective cup has a geometrical central axis, and the geometrical central axis of the first light source is aligned with the geometrical central axis of the first reflective cup, and wherein the lid defines the first recess for receiving the bonding wire so that the bonding wire is spaced from the lid.

2. The optical device according to claim 1, wherein the reflective film comprises a first layer having a first refractive index and a second layer having a second refractive index, and the first refractive index is different from the second refractive index.

3. The optical device according to claim 1, further comprising a second light source, wherein the lid further defines a second reflective cup adjacent to the first reflective cup.

4. The optical device according to claim 1, wherein the lid further defines a second recess, wherein the first and second recesses are disposed symmetrically with respect to a geometrical central axis of the first reflective cup.

5. The optical device according to claim 1, wherein the lid comprises an upper portion, a lower portion, and a middle portion, the first reflective cup is defined by the upper portion and the middle portion, and a lower surface of the middle portion is positioned above the top surface of the first light source.

6. An optical device, comprising:
a substrate;
a first light source disposed on the substrate;
a lid disposed on the substrate, the lid defining a first reflective cup for concentrating and passing light from the first light source, the lid comprising an upper portion, a lower portion, and a middle portion, the first reflective cup being defined by the upper portion and the middle portion, the first reflective cup positioned over the first light source and wherein a top surface of the first light source is positioned lower than the first reflective cup;
a film formed on an inner sidewall of the first reflective cup for reflecting the light from the first light source, the film comprising a primer layer, a reflecting layer and a protective layer, the film being free from covering an inner sidewall of the lower portion of the lid; and
a bonding wire comprising a loop extending into the first reflective cup defined by the lid, the lid defining a first recess accommodating at least a portion of the bonding wire;

wherein the first light source has a geometrical central axis and the first reflective cup has a geometrical central axis, and the geometrical central axis of the first light source is aligned with the geometrical central axis of the first reflective cup, and wherein the lid defines the first recess for receiving the bonding wire so that the bonding wire is spaced from the lid.

7. The optical device according to claim 6, wherein the primer layer includes a thermosetting polymer and the lid includes a thermoplastic polymer.

8. The optical device according to claim 6, wherein the film further comprises a first layer having a first refractive index and a second layer having a second refractive index, and the first refractive index is different from the second refractive index.

9. The optical device according to claim 6, wherein the film further comprises two or more layer pairs, each of the layer pairs comprises a first layer having a first refractive index and a second layer having a second refractive index, and the first refractive index is different from the second refractive index.

10. The optical device according to claim 6, further comprising a second light source, wherein the lid further defines a second reflective cup for passing light from the second light source, the second reflective cup having an inner sidewall for reflecting the light from the second light source, wherein the second light source has a geometrical central axis and the second reflective cup has a geometrical central axis, and the geometrical central axis of the second light source is aligned with the geometrical central axis of the second reflective cup.

11. The optical device according to claim 6, wherein the lid and the reflective cup are formed integrally.

12. The optical device according to claim 6, wherein the bonding wire is electrically coupled to the first light source and the substrate.

13. The optical device according to claim 12, wherein a highest point of the loop of the bonding wire is higher than the lower surface of the middle portion.

14. An optical device, comprising:
a light source; and
a lid comprising:
an upper portion, a lower portion, and a middle portion formed integrally with the upper portion and the lower portion, the upper portion and the middle portion defining a reflective cup positioned over the light source, and the middle portion defining at least one recess and wherein a top surface of the light source is positioned lower than the reflective cup;
a reflective film covering an inner sidewall of the reflective cup in the upper portion and covering at least a portion of an inner sidewall of the middle portion, the reflective film being free from covering an inner sidewall of the lower portion; and
a bonding wire comprising a loop extending into the reflective cup, the at least one recess accommodating at least a portion of the bonding wire, and
wherein the lid defines the first recess for receiving the bonding wire so that the bonding wire is spaced from the lid.

15. The optical device according to claim 14, wherein the film comprises a primer layer of a thermosetting polymer, and wherein the lid comprises a thermoplastic polymer.

* * * * *